US010003274B2

(12) United States Patent
Takahashi et al.

(10) Patent No.: US 10,003,274 B2
(45) Date of Patent: Jun. 19, 2018

(54) POWER CONVERSION DEVICE

(71) Applicant: Hitachi Automotive Systems, Ltd., Hitachinaka-shi, Ibaraki (JP)

(72) Inventors: Masayoshi Takahashi, Tokyo (JP); Keisuke Fukumasu, Tokyo (JP); Yuki Fujita, Hitachinaka (JP); Takeshi Kato, Hitachinaka (JP); Hiroki Funato, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 80 days.

(21) Appl. No.: 14/909,577

(22) PCT Filed: Aug. 6, 2014

(86) PCT No.: PCT/JP2014/070707
§ 371 (c)(1),
(2) Date: Feb. 2, 2016

(87) PCT Pub. No.: WO2015/040970
PCT Pub. Date: Mar. 26, 2015

(65) Prior Publication Data

US 2016/0181940 A1 Jun. 23, 2016

(30) Foreign Application Priority Data

Sep. 18, 2013 (JP) ................................ 2013-192816

(51) Int. Cl.
*H05K 5/00* (2006.01)
*H02M 7/00* (2006.01)
(Continued)

(52) U.S. Cl.
CPC .......... *H02M 7/003* (2013.01); *H05K 5/0026* (2013.01); *H05K 5/0247* (2013.01);
(Continued)

(58) Field of Classification Search
None
See application file for complete search history.

(56) References Cited

U.S. PATENT DOCUMENTS 6,762,937 B2 * 7/2004 Kimoto ................ H02M 7/003 165/185
8,916,967 B1 * 12/2014 Yamashita ........... H02M 7/003 257/723
(Continued)

FOREIGN PATENT DOCUMENTS

JP 5-259683 A 10/1993
JP 11-299260 A 10/1999
(Continued)

OTHER PUBLICATIONS

English translation of Japanese-language Office Action issued in Counterpart Japanese Application No. 2015-537596 dated Dec. 20, 2016 (4 pages).
(Continued)

*Primary Examiner* — Courtney Smith
*Assistant Examiner* — Rashen E Morrison
(74) *Attorney, Agent, or Firm* — Crowell & Moring LLP

(57) ABSTRACT

A power conversion device includes: a metal housing; a power semiconductor module that is contained in the metal housing and converts direct electric current to alternating electric current; a capacitor module that is contained in the metal housing and arranged side by side with the power semiconductor module, wherein the capacitor module smoothes the direct electric current supplied to the power semiconductor module; a substrate that has a drive circuit part mounted in a first region, the drive circuit part driving the power semiconductor module, and a control circuit part mounted in a second region, the control circuit part controlling the drive circuit part, wherein the substrate is disposed so as to cover over the metal housing; a base plate that
(Continued)

100 120 110 11 12 13 1a 10 1 21a 30 40 51 21b 21c 50 extends in a space in which the second region of the substrate and the capacitor module oppose to each other, and that is electrically connected to the metal housing; and a first noise shielding member that extends in a direction along a boundary between the first region and the second region of the substrate, wherein the first noise shielding member separates the space from a space of the housing in which the power semiconductor module is disposed, and the first noise shielding member is electrically connected to the metal housing or a ground of the control circuit part.

13 Claims, 21 Drawing Sheets

(51) Int. Cl.

*H05K 7/14* (2006.01)
*H05K 5/02* (2006.01)
*H05K 5/04* (2006.01)
*H05K 9/00* (2006.01)

(52) U.S. Cl.

CPC ............. *H05K 5/04* (2013.01); *H05K 7/1432* (2013.01); *H05K 9/002* (2013.01)

(56) References Cited

U.S. PATENT DOCUMENTS 9,013,877 B2 * 4/2015 Harubeppu ............. H01L 23/34 165/80.1
9,115,707 B2 * 8/2015 Hattori .................. F04B 39/121
9,350,228 B2 * 5/2016 Uetake .................. H02M 7/003
2002/0038981 A1 * 4/2002 Brown ................. H05K 7/1471 307/125
2003/0128535 A1 * 7/2003 Otani ................... H05K 9/0016 361/816
2008/0112201 A1 * 5/2008 Yahata .................. H02M 7/003 363/131
2009/0040724 A1 * 2/2009 Nishikimi .......... H05K 7/20927 361/699
2011/0261588 A1 * 10/2011 Hattori .................. F04B 39/121 363/13
2013/0088128 A1 * 4/2013 Nakano ................ B62D 5/0406 310/68 R
2013/0265808 A1 * 10/2013 Ishii ........................ H02M 1/12 363/97
2015/0256096 A1 * 9/2015 Nishizawa ............... H01G 2/04 363/131
2015/0305188 A1 * 10/2015 Maeda ................. H05K 7/1432 361/728
2016/0181940 A1 * 6/2016 Takahashi ............. H02M 7/003 361/752

FOREIGN PATENT DOCUMENTS

JP 11-299262 A 10/1999
JP 2004-193163 A 7/2004
JP 3836785 B2 10/2006
JP 2011-1869 A 1/2011
WO WO 2012/056735 A1 5/2012

OTHER PUBLICATIONS

International Search Report (PCT/ISA/210) issued in PCT Application No. PCT/JP2014/070707 dated Nov. 18, 2014 with English-language translation (four (4) pages).

* cited by examiner

POWER CONVERSION DEVICE

TECHNICAL FIELD

The present invention relates to a power conversion device.

BACKGROUND ART

Along with the downsizing of hybrid vehicles or electric vehicles, reduction in size of vehicle parts including power conversion devices used for the vehicles has been required. In this respect, the power conversion device is mounted on a vehicle part such as a transmission or a motor, so that the power conversion device and a case of the transmission or the motor can be integrated together, which can result in a reduction in system cost and downsizing on the whole. In this context, for downsizing of the whole vehicle, there may be a strong demand for a reduction in thickness, in particular.

For an internal structure of the power conversion device, integration of a plurality of circuit substrates in the device is getting attention for a reduction in cost resulting from a reduction in thickness and elimination of harnesses between the substrates. For example, the power conversion device includes a motor control circuit (MC) substrate for motor control by means of onboard microcomputers, and a drive circuit (GD) substrate for ON/OFF control of gates of power switching elements having IGBTs and the like. Since there are a multiplicity of control wirings between the MC substrate and the GD substrate, the trend has been toward integration of the substrates.

However, in conventional power conversion devices, if a noise of high voltage side switching parts (a power module, AC bus bars, the GD substrate) enters into the MC substrate in a low voltage side, the switching noise propagating to the MC substrate leaks out of the power conversion device via signal harnesses or the like. This electromagnetic noise presents a problem. Thus, a metal base plate is arranged between the high voltage switching parts and the MC substrate, i.e. a low voltage part, for example, so that the base plate interrupts the noise between the high voltage switching parts and the MC substrate. However, when the MC substrate and the GD substrate are integrally formed in one substrate, there is a problem of the switching noise propagating from the GD part to a vicinity of the MC part and then leaking out via a connector or the like, which is a case opening part, to the outside.

As an approach of suppressing such a noise propagation, a structure is known that includes a shielding part so as to close the case opening part (connector part), in order to interrupt noise radiation from an electromagnetic wave oscillating part to the outside of the case or noise entry from the outside (see PTL1).

CITATION LIST

Patent Literature

PTL1: Japanese Patent No. 3836785

SUMMARY OF INVENTION

Technical Problem

However, in the configuration described in the above literature, the noise that enters from the high voltage switching parts into the MC part, i.e. the low voltage side, can not be prevented, which can result in deterioration in accuracy or malfunction of circuits in the MC part, or the noise can leak out via external signals in the MC part to the outside of the case.

Solution to Problem

A power conversion device according to a first aspect of the present invention comprises: a metal housing; a power semiconductor module that is contained in the metal housing and converts direct electric current to alternating electric current; a capacitor module that is contained in the metal housing and arranged side by side with the power semiconductor module, wherein the capacitor module smoothes the direct electric current supplied to the power semiconductor module; a substrate that has a drive circuit part mounted in a first region, the drive circuit part driving the power semiconductor module, and a control circuit part mounted in a second region, the control circuit part controlling the drive circuit part, wherein the substrate is disposed so as to cover over the metal housing; a base plate that extends in a space in which the second region of the substrate and the capacitor module oppose to each other, and that is electrically connected to the metal housing; and a first noise shielding member that extends in a direction along a boundary between the first region and the second region of the substrate, wherein the first noise shielding member separates the space from a space of the housing in which the power semiconductor module is disposed, and the first noise shielding member is electrically connected to the metal housing or a ground of the control circuit part.

A power conversion device according to a second aspect of the present invention comprises: a metal housing; a power semiconductor module that is contained in the metal housing and converts direct electric current to alternating electric current; a capacitor module that is contained in the metal housing and arranged side by side with the power semiconductor module, wherein the capacitor module smoothes the direct electric current supplied to the power semiconductor module; a substrate that has a drive circuit part mounted in a first region, the drive circuit part driving the power semiconductor module, and a control circuit part mounted in a second region, the control circuit part controlling the drive circuit part, wherein the substrate is disposed so as to cover over the metal housing, with one of both surfaces of the substrate opposing to the power semiconductor module and the capacitor module; a lid member that is a metal member covering an opening part of the housing and opposes to another surface that is opposite to the one surface of the substrate; a base plate that extends in a space in which the second region of the substrate and the capacitor module oppose to each other, and that is electrically connected to the metal housing; a first noise shielding member that extends in a direction along a boundary between the first region and the second region of the substrate, wherein the first noise shielding member separates a space in which the other surface of the substrate and the lid member oppose to each other into a first space in which the first region and the lid member oppose to each other and a second space in which the second region and the lid member oppose to each other, and the first noise shielding member is electrically connected to at least one of a ground of the control circuit part mounted in the second region and the lid member; and a second noise shielding member that is provided in the second space in which the second region and the lid member oppose to each other, wherein an extension line in an extension direction of the second noise shielding member intersects the first noise shielding member, and the second noise shielding member is electrically connected to at least one of the ground of the control circuit part mounted in the second region and the lid member.

Advantageous Effects of Invention

According to the present invention, the noise propagation can effectively be suppressed with a simple configuration, so that the reliability of the power conversion device can be improved while suppressing an increase in cost.

DESCRIPTION OF EMBODIMENTS

First Embodiment

Figure 1:
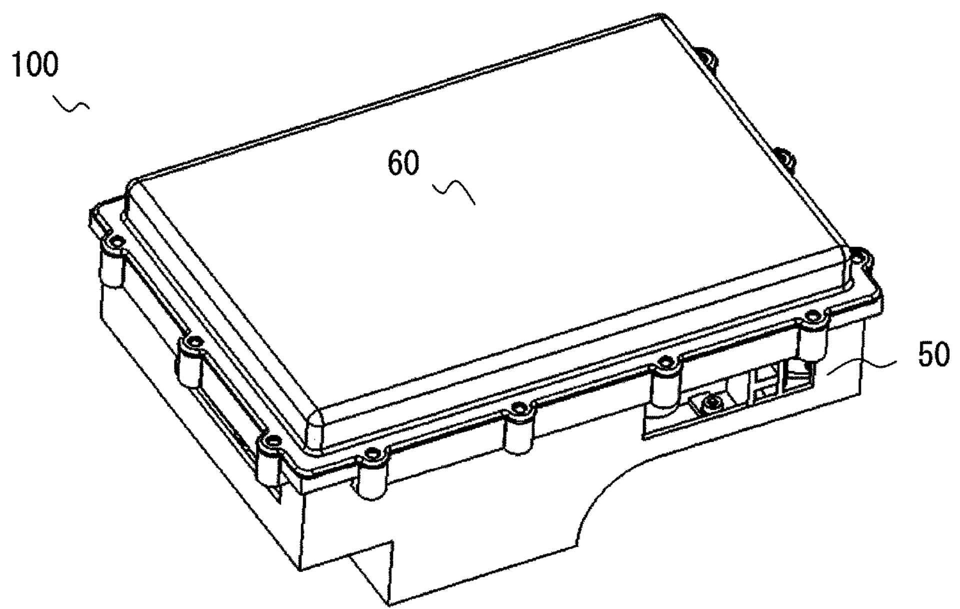
FIG. 1 is a perspective view showing an outer appearance of a power conversion device according to a first embodiment.
Figure 2:
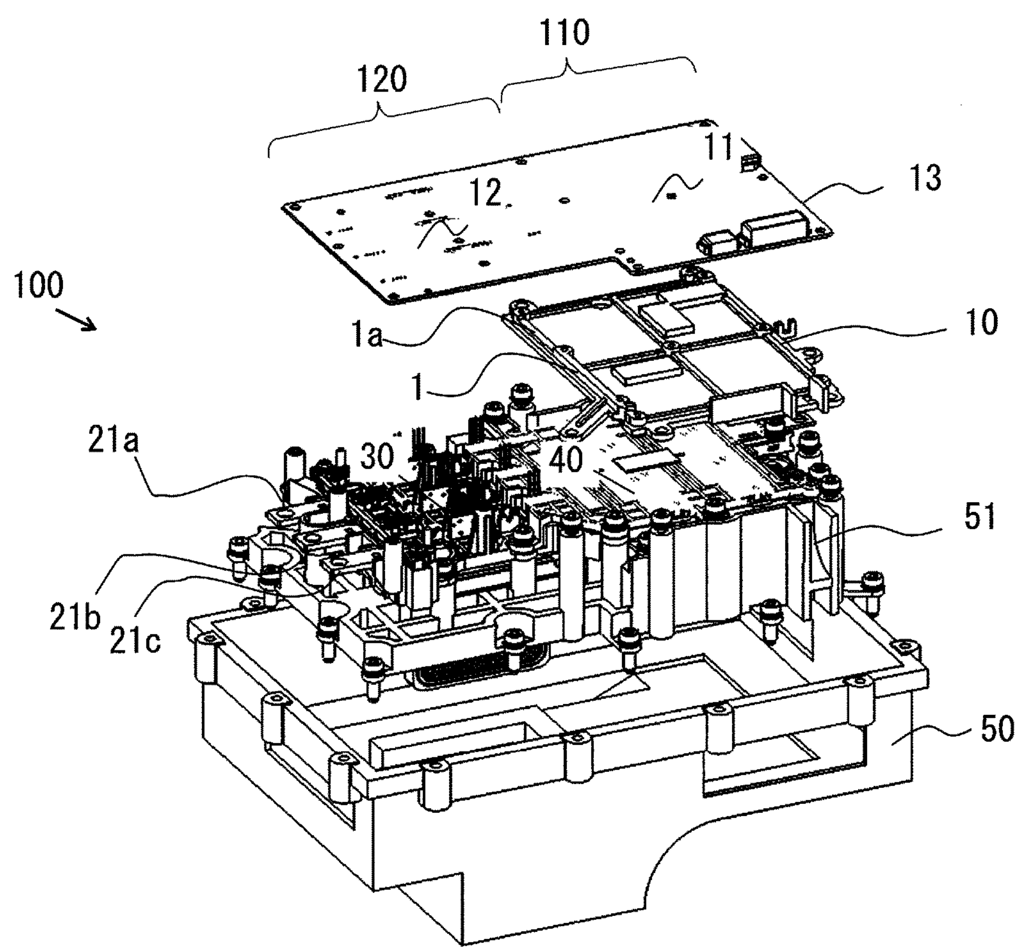
FIG. 2 is a perspective view in which the power conversion device according to the first embodiment is exploded into its components.
Figure 3:
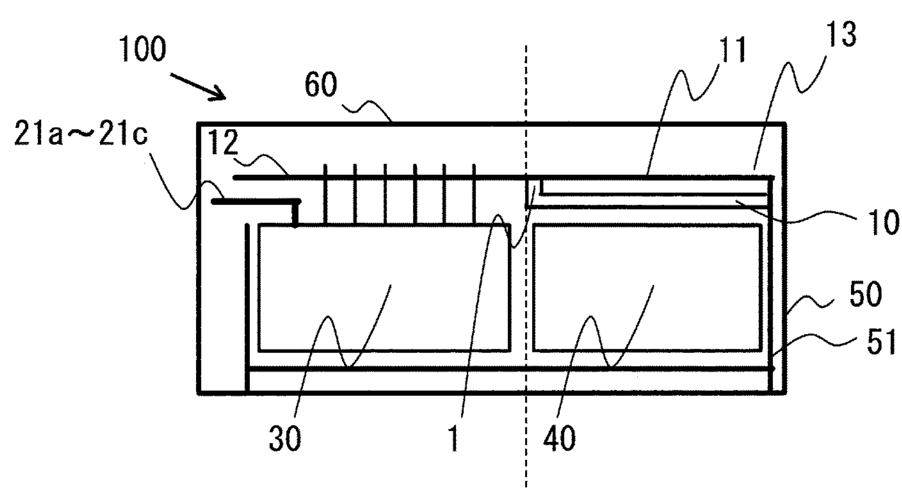
FIG. 3 is a schematic cross-sectional view of the power conversion device.

Referring to FIGS. 1 to 3, one embodiment of a power conversion device according to the present invention will be described. The power conversion device in this embodiment is mounted in hybrid vehicles or electric vehicles, for example. FIG. 1 is an outer perspective view of the power conversion device 100 according to this embodiment and FIG. 2 is a perspective view in which the power conversion device 100 is exploded into its components, for illustrating the whole configuration of the power conversion device 100. The power conversion device 100 includes a circuit substrate 13 having a MC part 11 and a GD part 12 mounted thereon, a metal base plate 10, AC bus bars 21*a*-21*c*, a power semiconductor module 30, and a capacitor module 40. These members are contained in a case 50 which is a metal housing. A top (as shown in the figure) opening of the case 50 is closed with a metal lid 60.

The power semiconductor module 30 is a module that is constructed by combining IGBTs, free wheel diodes and the like and converts direct current power to alternating current power. The capacitor module 40 is a module that smoothes the direct current power. The circuit substrate 13 is a substrate having the GD part 12 mounted thereon, in which the GD part 12 is a drive circuit that outputs a drive signal for driving the power semiconductor module 30. The circuit substrate 13 further has the MC part 11 mounted thereon, in which the MC part 11 is a control circuit part that outputs a control signal for controlling the power semiconductor module 30 to the GD part 12. It is to be noted that, in the circuit substrate 13, the GD part 12 is mounted in a first region 120 on the left side in FIG. 2, while the MC part 11 is mounted in a second region 110 on the right side in FIG. 2.

Direct current power from an external high-voltage battery is supplied via the capacitor module 40 to the power semiconductor module 30. After being converted into alternating current power in the power semiconductor module 30, the power is supplied via the AC bus bars 21*a*-21*c* to a motor (not shown). The capacitor module 40 and the power semiconductor module 30 are mounted in a metal case 51. The case 51 is connected to the case 50 with a screw or the like. The case 51 is also electrically connected to the case 50.

Between the capacitor module 40 with the case 51 and the circuit substrate 13, the metal base plate 10 is arranged. The metal base plate 10 is fixed to the case 51. It is thus possible to prevent that a high voltage noise from the capacitor module 40 mounted in the case 51 or direct current side conductor plates 22*a* and 22*b* (see FIG. 4) affects the circuit substrate 13, in particular the MC part 11. Furthermore, electronic components such as the MC part 11 and the GD part 12 are cooled by allowing heat generated from the electronic components to escape via the metal base plate 10 to the case 51 or a cooling part within the case 51.

If a switching noise of high voltage side switching parts (the power semiconductor module 30, the AC bus bars 21*a*-21*c*, and the GD part 12) would enter into a low voltage side, i.e. the MC part 11, the switching noise propagating into circuits or a ground layer in the MC part 11 could leak out of the power conversion device via signal harnesses (not shown) or the like. One of main propagation paths of this noise is a path along which the noise propagates from the high voltage side switching parts to a space between the circuit substrate 13 and the metal base plate 10 and then enters into wirings in the substrate or a ground in the substrate of the MC part 11.

In order to suppress the propagation of the noise along this path, a shielding part 1 is formed in the metal base plate 10. The shielding part 1 extends in a direction along a boundary of the MC part 11 and the GD part 12, i.e. a boundary between the first region 120 and the second region 110, and projects from an upper (as shown in the figure) surface of the metal base plate 10 toward the circuit substrate 13. FIG. 3 is a schematic cross-sectional view of the power conversion device 100, illustrating where the shielding part 1 is formed.

It is to be noted that, as shown in FIG. 2, there is a section 1*a* in the shielding part 1 that has a reduced height from a halfway point of the shielding part 1 in the left top direction in the figure along the boundary of the first region 120 and the second region 110. This section 1*a* is a recess that avoids contact with a circuit pattern for connecting the MC part 11 and the GD part 12 which is provided in a lower (as shown in the figure) surface layer of the circuit substrate 13. However, it is desirable that the section 1*a*, which acts as the recess, is not provided if the circuit pattern for connecting the MC part 11 and the GD part 12 is provided in an inner layer of the circuit substrate 13.

It is preferable to electrically connect the shielding part 1 to the ground layer formed in the MC part 11 of the circuit substrate 13. In this case, the noise shielding effect is improved because the metal base plate 10 is further electrically connected to the ground layer of the MC part 11 at an upper (as shown in the figure) end of the shielding part 1.

It is to be noted that the present invention does not limit the way of connection between the shielding part 1 and the ground layer formed in the MC part 11, but it is only necessary that the shielding part 1 and the ground layer of the MC part 11 are electrically connected. Furthermore, in terms of contact area, contact with the entire upper (as shown in the figure) surface of the shielding part 1 is not necessarily required. Even a partial contact has the effect of reducing the noise propagation. However, it is preferable to make the contact area as large as possible.

Although the shielding part 1 is integrally formed with the metal base plate 10 and projects toward the circuit substrate 13 in the first embodiment, the present invention is not limited to this configuration. For example, the metal shielding part 1 may be configured as a separate member from the metal base plate 10 and be electrically connected to the metal base plate 10 and/or the ground layer formed in the MC part 11.

Thus, the power conversion device 100 in this embodiment can effectively suppress the noise propagation with a simple configuration, so that the reliability of the power conversion device 100 can be improved while suppressing an increase in cost.

Second Embodiment

Figure 4:
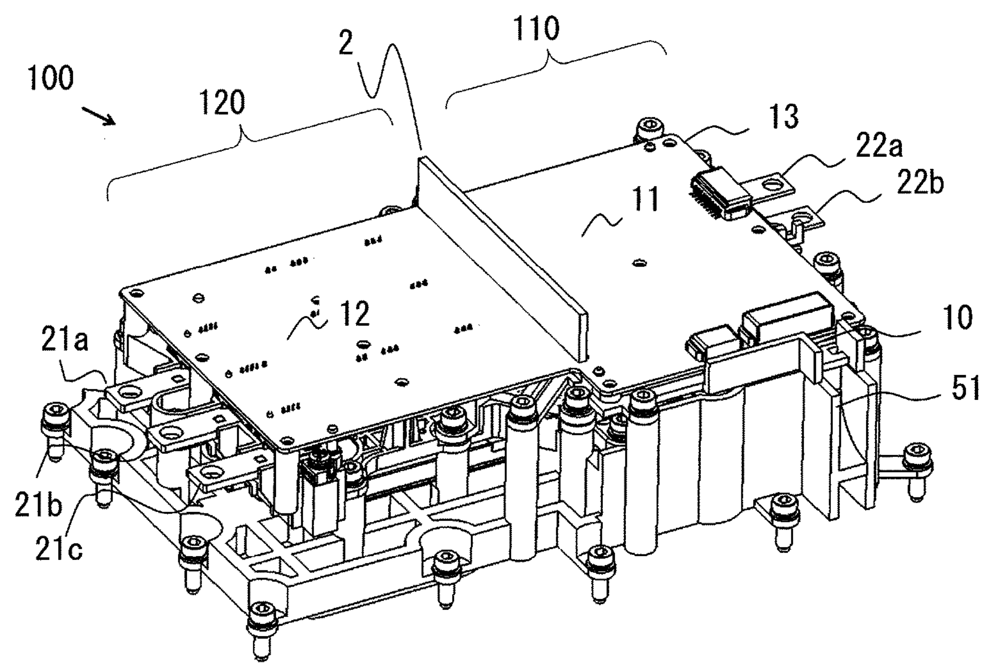
FIG. 4 is an outer perspective view of the power conversion device according to a second embodiment.
Figure 5A:
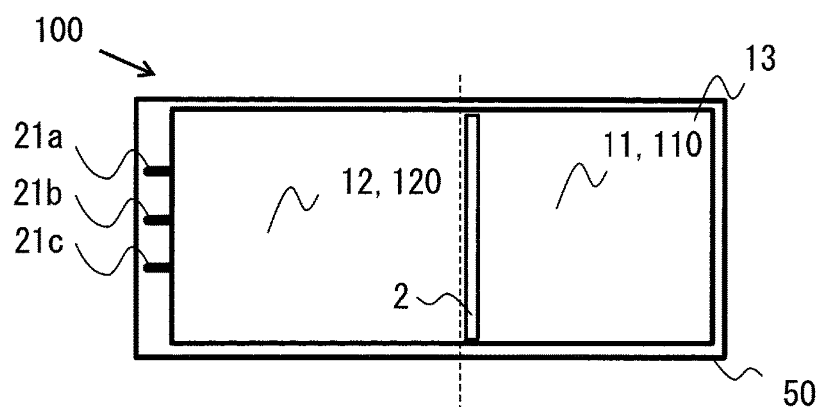
FIGS. 5A and 5B are schematic plan and cross-sectional views of the power conversion device according to the second embodiment.
Figure 5B:
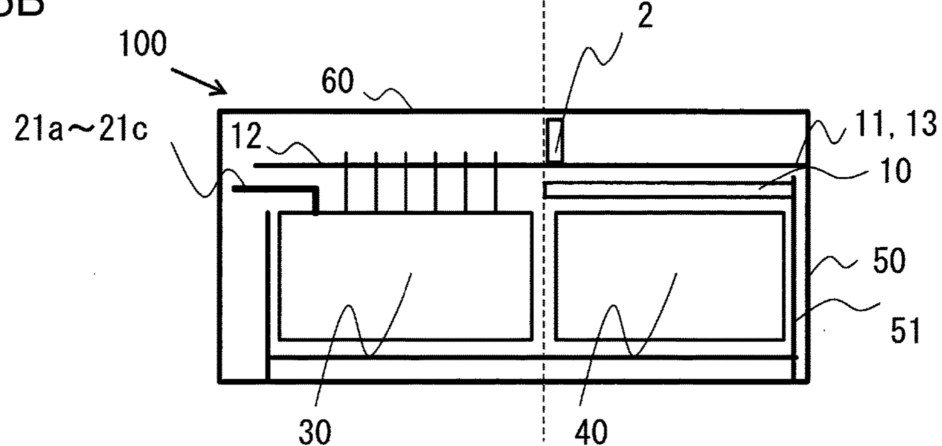

Referring to FIGS. 4 and 5, a second embodiment of the power conversion device according to the present invention will be described. In the following description, the same components as those in the first embodiment are denoted by the same reference signs, and differences from the first embodiment will mainly be described. Other points that are not specifically described are the same as those in the first embodiment. This embodiment differs from the first embodiment in that a shielding plate 2 is provided instead of the shielding part 1.

FIG. 4 is an outer perspective view showing the power conversion device 100 according to the second embodiment, and FIGS. 5(*a*), (*b*) are schematic plan and cross-sectional views of the power conversion device 100 according to the second embodiment, respectively.

In this embodiment, a main propagation path of the noise is a path along which the noise propagates from the high voltage side switching parts to a space between the circuit substrate 13 and the metal lid 60 and then enters into wirings in the substrate or a ground in the substrate of the MC part 11. In order to suppress the propagation of the noise along this path, the metal shielding plate 2 is provided in this embodiment.

The metal shielding plate 2 is a plate-like member that extends in a direction along the boundary between the first region 120 and the second region 110 and that is provided upright from an upper (as shown in the figure) surface of the circuit substrate 13 toward a lower surface of the lid 60 shown in FIG. 1. The metal shielding plate 2 is further fixed to the circuit substrate 13. The shielding plate 2 is electrically connected to the ground layer formed in the MC part 11 of the circuit substrate 13.

A gap may be present between the shielding plate 2 and the lower surface of the metal lid 60. However, it is preferable that the gap is narrower. It is further preferable that the shielding plate 2 and the metal lid 60 contact with each other. By the shielding plate 2 contacting the lower surface of the metal lid 60, upper and lower (as shown in the figure) ends of the shielding plate 2 are connected to grounds, which results in improvement in the shielding effect.

It is to be noted that the present invention does not limit the way of connection between the shielding plate 2 and the ground layer formed in the MC part 11 or the metal lid 60, but it is only necessary to electrically connect the shielding plate 2 and the ground layer formed in the MC part 11 and/or the metal lid 60. Furthermore, in terms of contact area, contact with the entire upper or lower (as shown in the figure) ends of the shielding plate 2 is not necessarily required. Even a partial contact has the effect of reducing the noise propagation. However, it is preferable to make the contact area as large as possible.

Figure 6A:
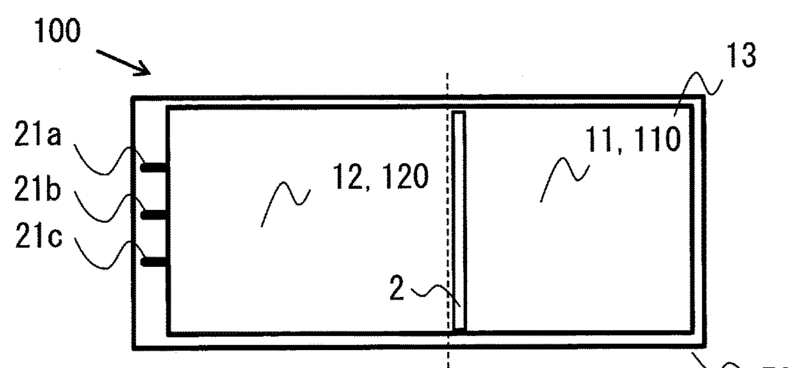
FIGS. 6A and 6B are views showing a variation of the second embodiment.
Figure 6B:
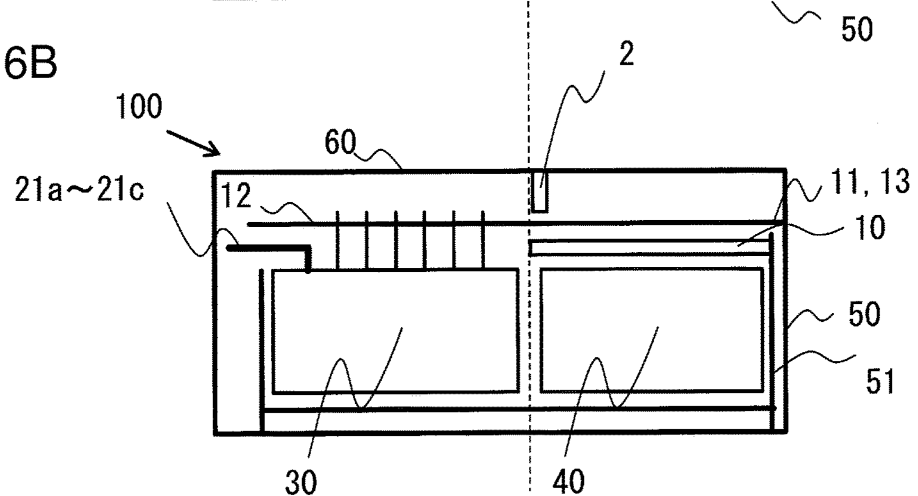

Although the shielding plate 2 is a metal member that contacts the ground layer formed in the MC part 11 of the circuit substrate 13 in this embodiment, the present invention is not limited to this configuration. For example, the shielding plate 2 may be provided projecting from the lower surface (inner surface) of the metal lid 60 along the boundary of the MC part 11 and the GD part 12 toward the circuit substrate 13, as shown in FIGS. 6(*a*) and (*b*). In this case, it is preferable that the lower end of the shielding plate 2 projecting from the lower surface of the metal lid 60 toward the circuit substrate 13 opposes to the ground layer formed in the MC part 11. It is further preferable that the lower end of the shielding plate 2 projecting from the metal lid 60 contacts the ground layer formed in the MC part 11.

In this way, the power conversion device 100 in this embodiment can effectively suppress the noise propagation with a simple configuration, so that the reliability of the power conversion device 100 can be improved while suppressing an increase in cost.

Third Embodiment

Figure 7:
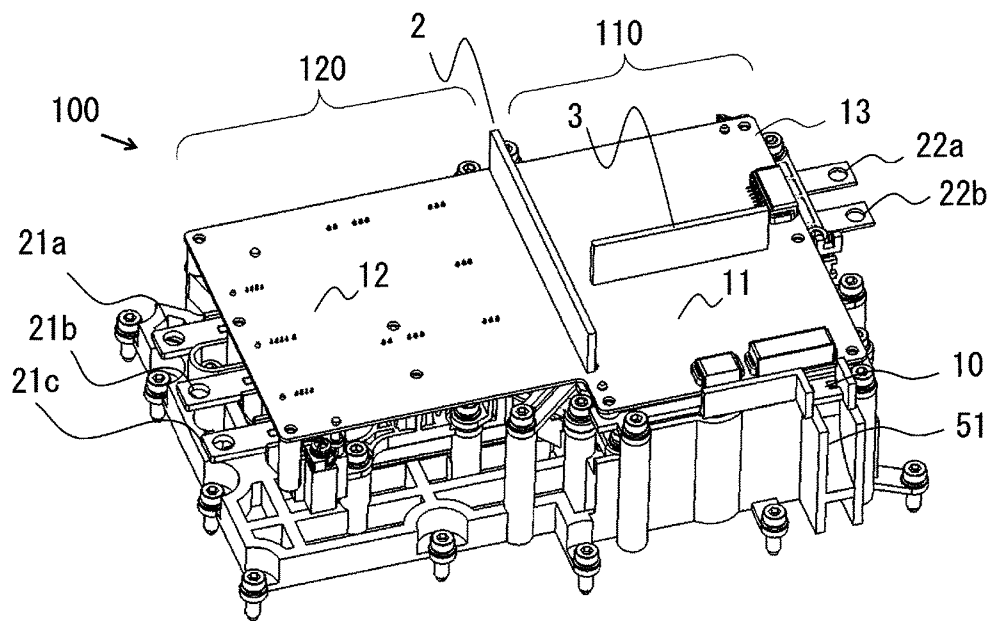
FIG. 7 is an outer perspective view of the power conversion device according to a third embodiment.
Figure 8A:
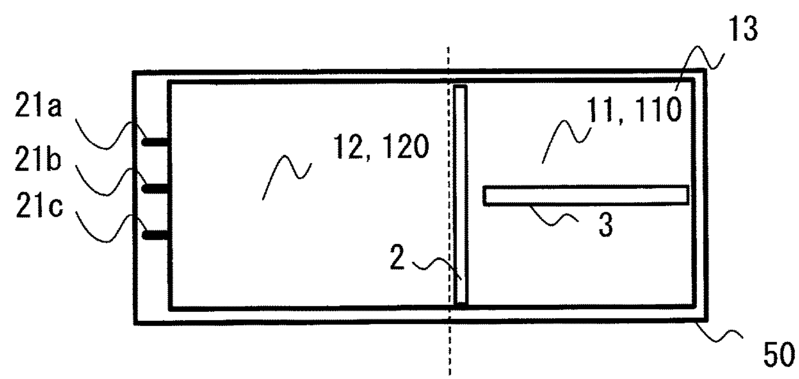
FIGS. 8A and 8B are schematic plan and schematic cross-sectional views of the power conversion device according to the third embodiment.
Figure 8B:
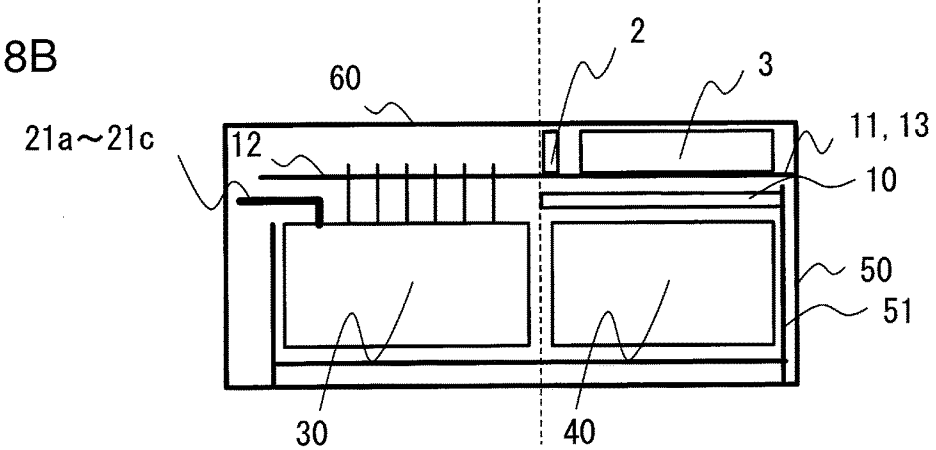

Referring to FIGS. 7 and 8, a third embodiment of the power conversion device according to the present invention will be described. In the following description, the same components as those in the first and second embodiments are denoted by the same reference signs, and differences from the first and second embodiments will mainly be described. Other points that are not specifically described are the same as those in the first and second embodiments. This embodiment differs from the second embodiment in that a shielding plate 3 is provided in addition to the shielding plate 2 in the second embodiment.

FIG. 7 is an outer perspective view showing the power conversion device 100 according to the third embodiment, and FIGS. 8(*a*) and (*b*) are schematic plan and cross-sectional views of the power conversion device 100 according to the third embodiment, respectively. In this embodiment, the shielding plate 2 contacts either one of the ground layer formed in the MC part 11 and the metal lid 60. For example, the shielding plate 2 contacts the ground layer formed in the MC part 11 and is separated from the metal lid 60.

A laterally elongated slit-like gap is formed between the shielding plate 2 and the metal lid 60. Even in the condition in which such a gap is formed, the effect of reducing a switching noise propagating in the space from the high voltage side switching parts (the power semiconductor module 30, the AC bus bars 21*a*-21*c*, and the GD part 12) still remains. However, an electromagnetic noise having a vertically polarized component can pass through the gap with less loss and arrive at the top of the MC part 11.

In this embodiment, in order to reduce propagation of the vertically polarized electromagnetic noise, the metal shielding plate 3 extending in a direction orthogonal to an extension direction of the shielding plate 2 is provided in the center part of the MC part 11. The shielding plate 3 is provided upright toward the metal lid 60 in the second region 110 of the circuit substrate 13. In other words, the shielding plate 3 is a plate-like member that is provided upright from the upper (as shown in the figure) surface of the circuit substrate 13 toward the lower surface of the lid 60 in the second region 110. The shielding plate 3 is further fixed to the circuit substrate 13.

The shielding plate 3 is electrically connected to the ground layer formed in the MC part 11 of the circuit substrate 13. The shielding plate 3 is further disposed so that an extension line in an extension direction of the shielding plate 3 on the GD part 12 side intersects the shielding plate 2. As shown particularly in FIG. 8, the noise reduction effect is largest when the shielding plate 3 is disposed so that the extension line orthogonally intersects the shielding plate 2 in the center part of shielding plate 2. However, the shielding plate 3 may be disposed so that the extension line is offset from the center part of the shielding plate 2 in the extension direction of the shielding plate 2.

As described above, it is the noise having the vertically polarized component that is likely to pass through the gap between the shielding plate 2 and the metal lid 60. The shielding plate 3 serves to shunt the noise having the vertically polarized component, so that a significant effect of reducing the noise on the top of the MC part 11 is obtained. The noise reduction effect varies depending on the length of the shielding plate 3 and becomes larger as the shielding plate 3 extends longer from a position closer to the shielding plate 2.

Figure 9:
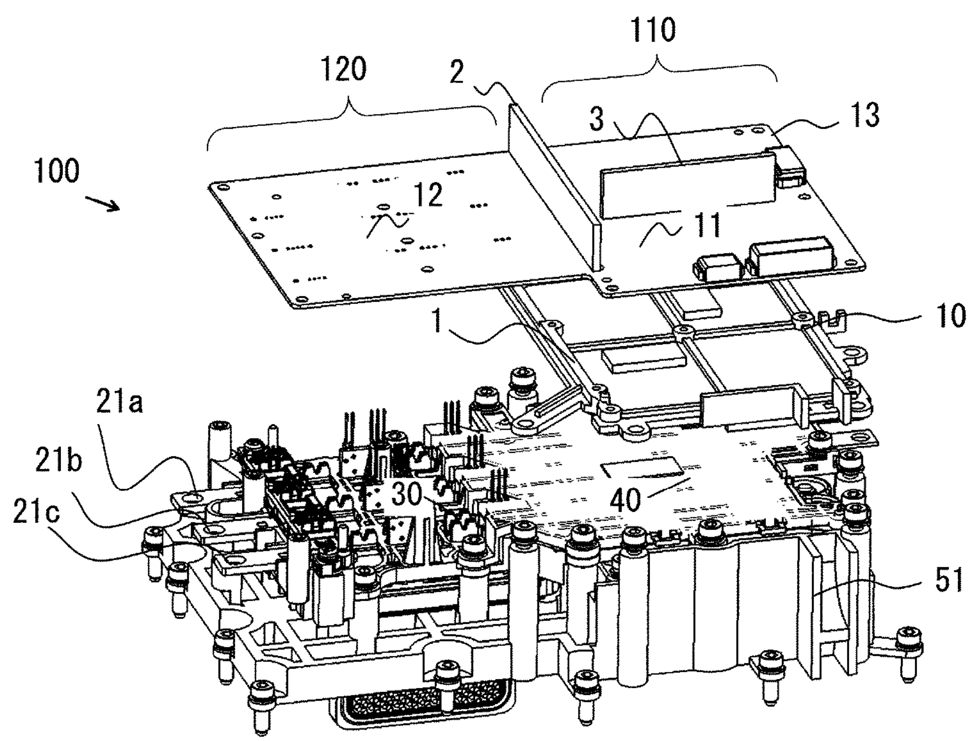
FIG. 9 is a view showing a variation.
Figure 10A:
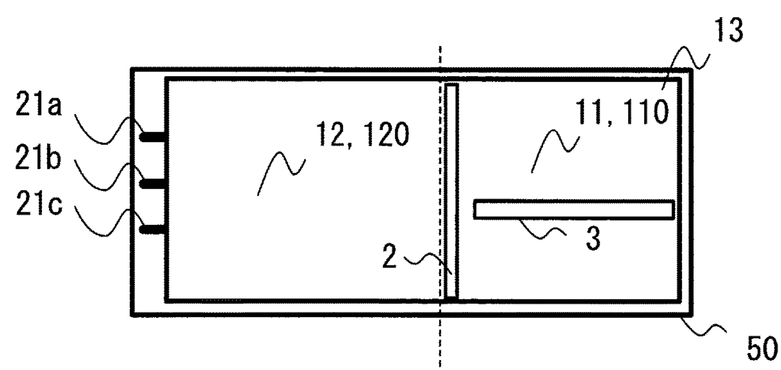
FIGS. 10A and 10B are views showing a variation.
Figure 10B:
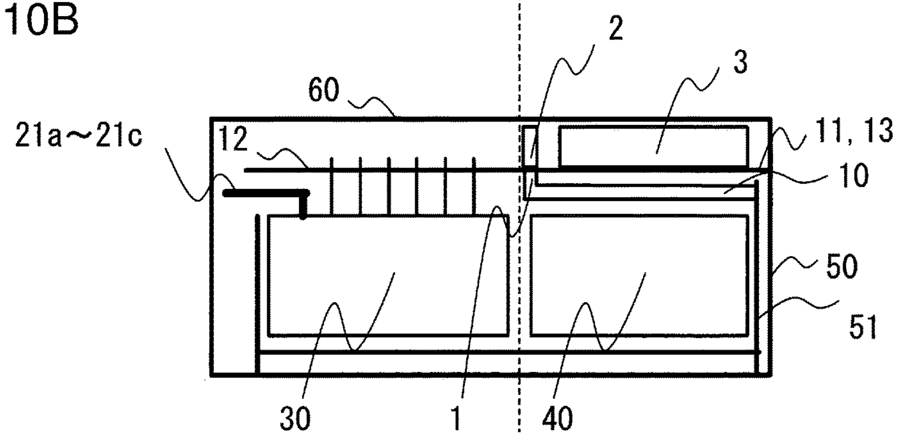
Figure 11A:
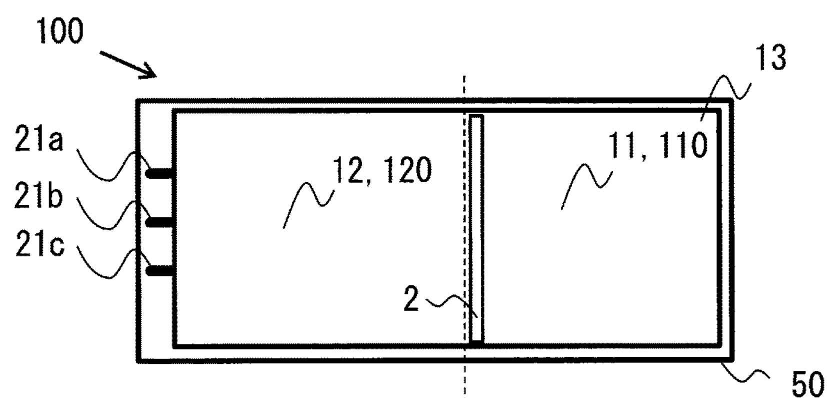
FIGS. 11A and 11B are views showing a variation.
Figure 11B:
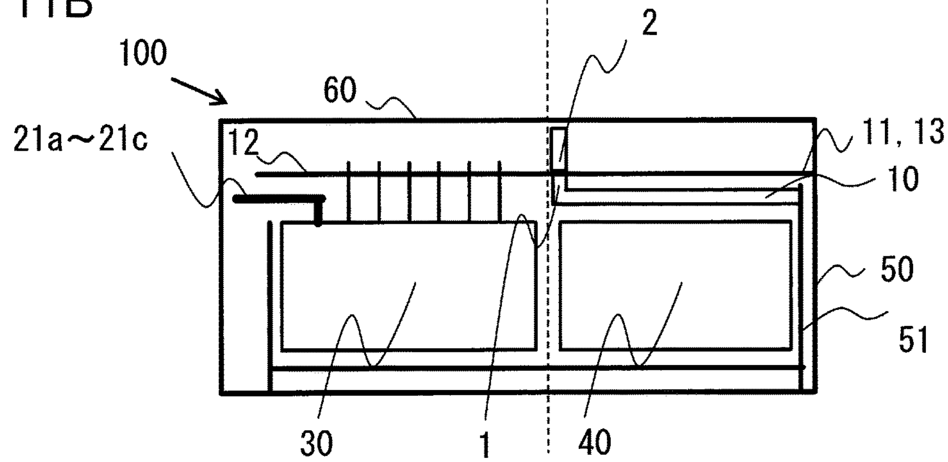

Although the first to third embodiments have been described above, the embodiments described above may be employed alone or in combination. This is because the effects in the respective embodiments can be obtained alone or in a synergistic manner. The present invention is not limited to the embodiments described above, as long as not compromising the characteristics of the present invention. In other words, the first and third embodiments in the present invention may be combined as in FIG. 9 and FIGS. 10(*a*) and (*b*) or the first and second embodiments may be combined as shown in FIGS. 11(*a*) and (*b*), for example.

Figure 12A:
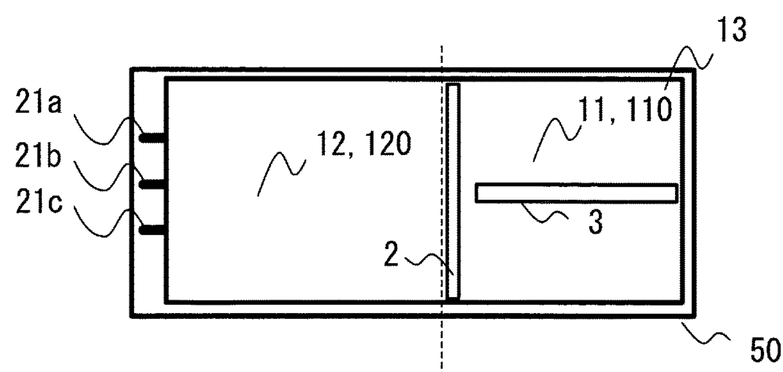
FIGS. 12A and 12B are views showing a variation.
Figure 12B:
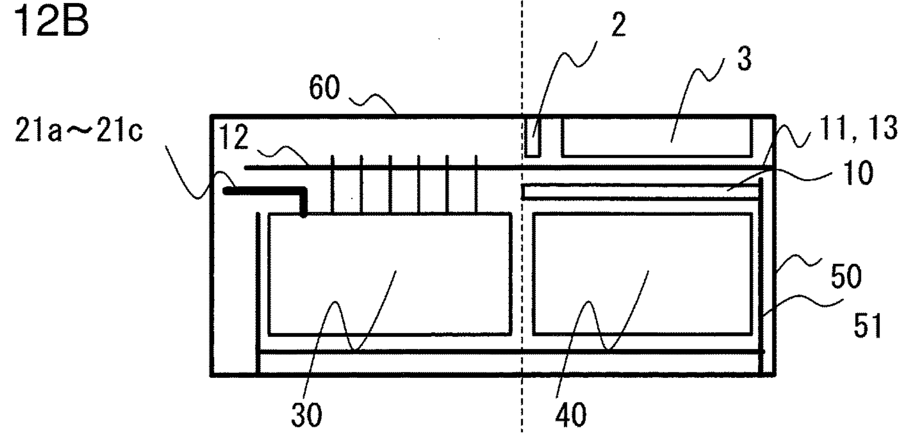
Figure 13A:
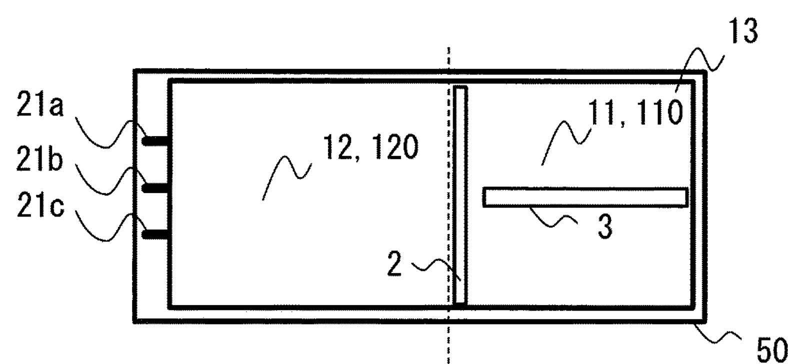
FIGS. 13A and 13B are views showing a variation.
Figure 13B:
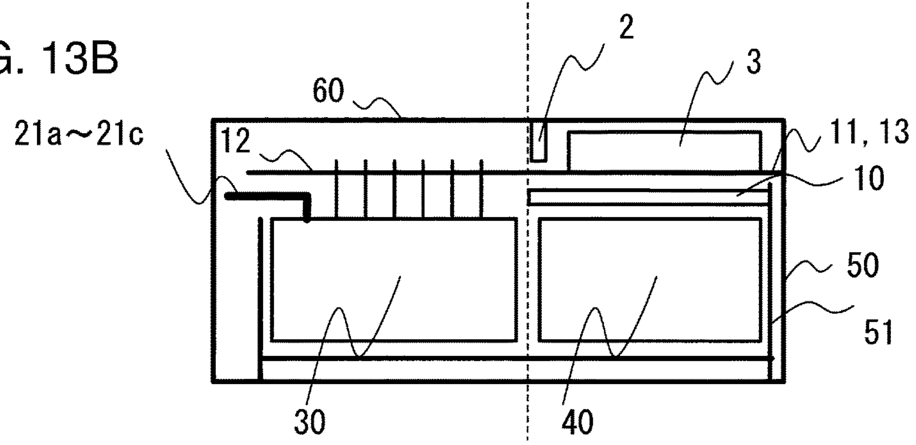
Figure 14A:
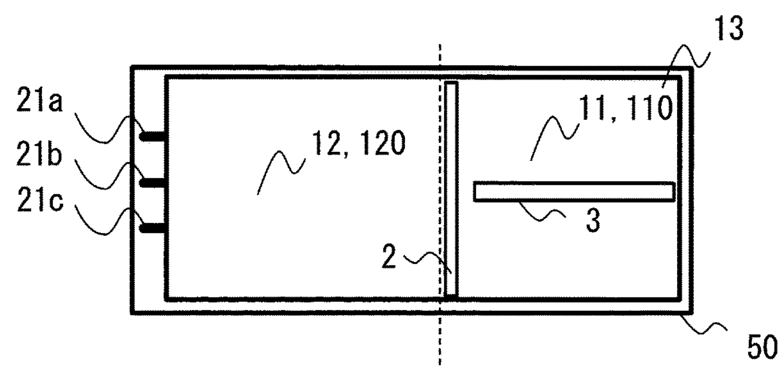
FIGS. 14A and 14B are views showing a variation.
Figure 14B:
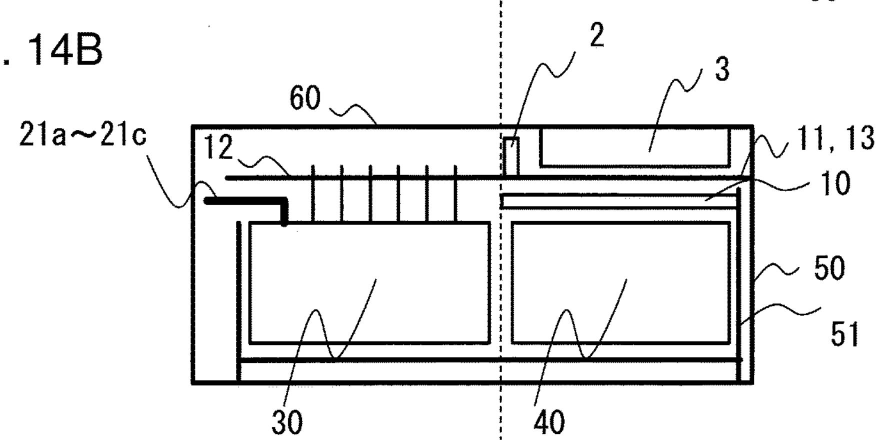

Furthermore, although the shielding plate 2 and the shielding plate 3 are metal members that contact the ground layer formed in the MC part 11 of the circuit substrate 13 in the third embodiment, the present invention is not limited to this configuration. A similar effect can be obtained by providing the shielding plate 2 and the shielding plate 3 on the lower surface of the metal lid 60 so that they project toward the circuit substrate 13, as shown in FIGS. 12 (*a*) and (*b*), for example. Furthermore, either one of the shielding plate 2 and the shielding plate 3 may contact the ground layer formed in the MC part 11 of the circuit substrate 13 and the other may be provided on the lower surface of the metal lid 60 so that it projects toward the circuit substrate 13, as shown in FIGS. 13(*a*) and (*b*) and FIGS. 14(*a*) and (*b*). The shielding plate 3 may also be disposed as in FIGS. 15-21 described below, for example. It is to be noted that FIGS. 15-21 are plan views schematically showing the positional relationship between the shielding plate 2 and the shielding plate 3.

Figure 15:
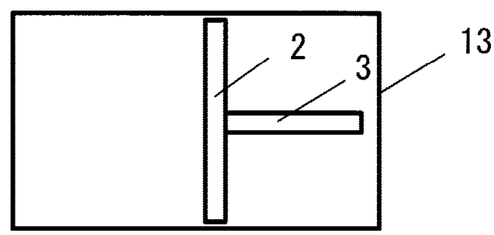
FIG. 15 is a view showing a variation.
Figure 16:
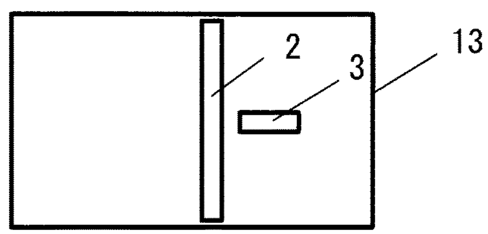
FIG. 16 is a view showing a variation.
Figure 17:
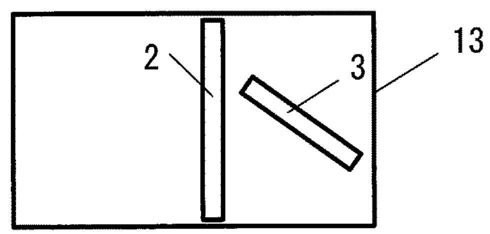
FIG. 17 is a view showing a variation.
Figure 18:
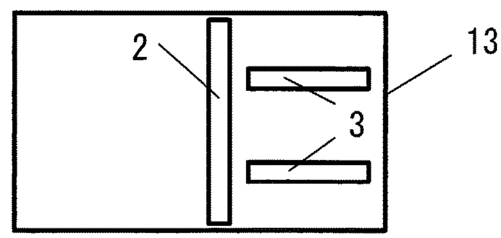
FIG. 18 is a view showing a variation.
Figure 19:
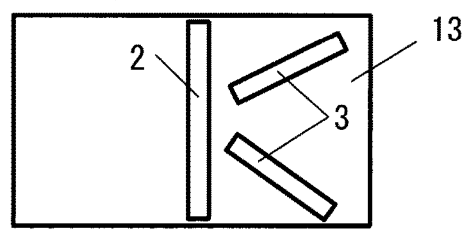
FIG. 19 is a view showing a variation.
Figure 20:
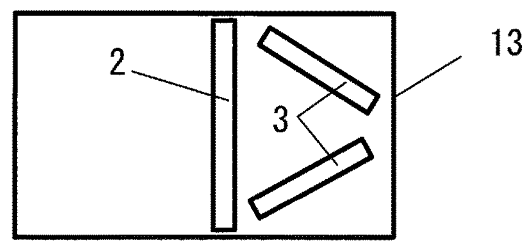
FIG. 20 is a view showing a variation.
Figure 21:
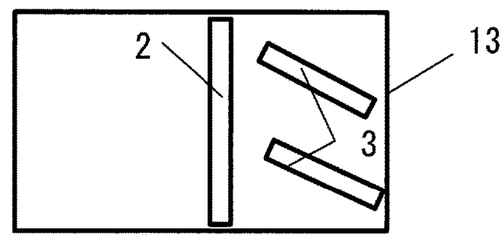
FIG. 21 is a view showing a variation.

Specifically, the shielding plate 3 may abut to the shielding plate 2 as shown in FIG. 15, the length of the shielding plate 3 may be reduced as shown in FIG. 16, the shielding plate 3 may be disposed obliquely to the shielding plate 2 as shown in FIG. 17, or two, three or more shielding plates 3 may be provided in parallel to each another as shown in FIG. 18. Furthermore, as shown in FIG. 19, two shielding plates 3 may be disposed so that they make a tapered form toward the shielding plate 2, i.e. a clearance between the shielding plates 3 becomes narrower toward the shielding plate 2. Furthermore, as shown in FIG. 20, two shielding plates 3 may be disposed so that they make a flared form toward the shielding plate 2, i.e. a clearance between the shielding plates 3 becomes wider toward the shielding plate 2. As shown in FIG. 21, two shielding plates 3 may also be disposed in parallel to each other and obliquely to the shielding plate 2. Also in the case where the shielding plate 3 is disposed as in each of FIGS. 12-21, a similar advantageous effect can be obtained as in the third embodiment shown in FIGS. 7 and 8.

Furthermore, although the example of the power conversion device driving one motor has been described in each of the embodiments described above, the present invention is not limited to this. A similar effect can also be obtained in the case where a plurality of motors are driven by a plurality of power modules, for example.

Furthermore, although the power conversion device according to each of the embodiments described above has been described as a device mainly for hybrid vehicles or electric vehicles, the device may be used for other applications in order to accomplish its effects. For example, the device may be used for inverters for household electric appliances such as refrigerators or air conditioners for the purpose of improvement in productivity or cooling performance. Furthermore, it may be used for inverters for industrial equipment, whose usage environment is similar to that of inverters for vehicles.

The present invention is not limited to the embodiments described above, but includes any of power conversion devices having a variety of structures, including: a metal housing; a power semiconductor module that is contained in the metal housing and converts direct electric current to alternating electric current; a capacitor module that is contained in the metal housing and arranged side by side with the power semiconductor module, wherein the capacitor module smoothes the direct electric current supplied to the power semiconductor module; a substrate that has a drive circuit part mounted in a first region, the drive circuit part driving the power semiconductor module, and a control circuit part mounted in a second region, the control circuit part controlling the drive circuit part, wherein the substrate is disposed so as to cover over the metal housing; a base plate that extends in a space in which the second region of the substrate and the capacitor module oppose to each other, and that is electrically connected to the metal housing; and a first noise shielding member that extends in a direction along a boundary between the first region and the second region of the substrate, wherein the first noise shielding member separates the space from a space of the housing in which the power semiconductor module is disposed, and the first noise shielding member is electrically connected to the metal housing or a ground of the control circuit part.

Furthermore, the present invention is not limited to the embodiments described above, but includes any of power conversion devices having a variety of structures, including: a metal housing; a power semiconductor module that is contained in the metal housing and converts direct electric current to alternating electric current; a capacitor module that is contained in the metal housing and arranged side by side with the power semiconductor module, wherein the capacitor module smoothes the direct electric current supplied to the power semiconductor module; a substrate that has a drive circuit part mounted in a first region, the drive circuit part driving the power semiconductor module, and a control circuit part mounted in a second region, the control circuit part controlling the drive circuit part, wherein the substrate is disposed so as to cover over the metal housing, with one of both surfaces of the substrate opposing to the power semiconductor module and the capacitor module; a lid member that is a metal member covering an opening part of the housing and opposes to another surface that is opposite to the one surface of the substrate; a base plate that extends in a space in which the second region of the substrate and the capacitor module oppose to each other, and that is electrically connected to the metal housing; a first noise shielding member that extends in a direction along a boundary between the first region and the second region of the substrate, wherein the first noise shielding member separates a space in which the other surface of the substrate and the lid member oppose to each other into a first space in which the first region and the lid member oppose to each other and a second space in which the second region and the lid member oppose to each other, and the first noise shielding member is electrically connected to at least one of a ground of the control circuit part mounted in the second region and the lid member; and a second noise shielding member that is provided in the second space in which the second region and the lid member oppose to each other, wherein an extension line in an extension direction of the second noise shielding member intersects the first noise shielding member, and the second noise shielding member is electrically connected to at least one of the ground of the control circuit part mounted in the second region and the lid member.

The disclosure of the following priority application is herein incorporated by reference:

Japanese Patent Application No. 2013-192816 (filed Sep. 18, 2013)

REFERENCE SIGNS LIST

1 . . . shielding part, 2 . . . shielding plate, 3 . . . shielding plate, 10 . . . base plate, 11 . . . MC part, 12 . . . GD part, 13 . . . circuit substrate, 30 . . . power semiconductor module, 40 . . . capacitor module, 50 . . . case, 60 . . . lid, 100 . . . power conversion device, 110 . . . second region, 120 . . . first region

The invention claimed is:

1. A power conversion device, comprising:

a metal housing;

a power semiconductor module that is contained in the metal housing and converts direct electric current to alternating electric current;

a capacitor module that is contained in the metal housing and arranged side by side with the power semiconductor module, wherein the capacitor module smoothes the direct electric current supplied to the power semiconductor module;

a substrate that has a drive circuit part mounted in a first region, the drive circuit part driving the power semiconductor module, and a control circuit part mounted in a second region, the control circuit part controlling the drive circuit part, wherein the substrate is disposed so as to cover over the metal housing;

a base plate that extends in a space in which the second region of the substrate and the capacitor module oppose to each other, and that is electrically connected to the metal housing; and a first noise shielding member that extends in a direction along a boundary between the first region and the second region of the substrate, wherein the first noise shielding member separates the space from a space of the housing in which the power semiconductor module is disposed, and the first noise shielding member is electrically connected to the metal housing or a ground of the control circuit part, wherein the first noise shielding member is integrally formed with the base plate, one surface of the substrate opposes to the power semiconductor module and the capacitor module, while another surface opposes to a metal lid member that covers an opening part of the housing, the power conversion device further comprises a second noise shielding member that is provided so as to oppose to the other surface of the substrate between the first region and the second region, and the second noise shielding member is electrically connected to at least one of the ground of the control circuit part mounted on the substrate, and the lid member.

2. The power conversion device according to claim 1, wherein:

the first noise shielding member is electrically connected to the ground of the control circuit part mounted on the second region.

3. The power conversion device according to claim 1, wherein:

the second noise shielding member is fixed to the substrate.

4. The power conversion device according to claim 1, wherein:

the second noise shielding member projects from the lid member.

5. The power conversion device according to claim 1, further comprising:

a third noise shielding member that is provided so as to oppose to the other surface of the substrate in a space in which the second region and the lid member oppose to each other, wherein an extension line in an extension direction of the third noise shielding member intersects the second noise shielding member, wherein:

the third noise shielding member is electrically connected to at least one of the ground of the control circuit part mounted on the substrate, and the lid member.

6. The power conversion device according to claim 5, wherein:

the third noise shielding member is fixed to the substrate.

7. The power conversion device according to claim 5, wherein:

the third noise shielding member projects from the lid member.

8. A power conversion device, comprising:

a metal housing;

a power semiconductor module that is contained in the metal housing and converts direct electric current to alternating electric current;

a capacitor module that is contained in the metal housing and arranged side by side with the power semiconductor module, wherein the capacitor module smoothes the direct electric current supplied to the power semiconductor module;

a substrate that has a drive circuit part mounted in a first region, the drive circuit part driving the power semiconductor module, and a control circuit part mounted in a second region, the control circuit part controlling the drive circuit part, wherein the substrate is disposed so as to cover over the metal housing, with one of both surfaces of the substrate opposing to the power semiconductor module and the capacitor module;

a lid member that is a metal member covering an opening part of the housing and opposes to another surface that is opposite to the one surface of the substrate;

a base plate that extends in a space in which the second region of the substrate and the capacitor module oppose to each other, and that is electrically connected to the metal housing;

a first noise shielding member that extends in a direction along a boundary between the first region and the second region of the substrate, wherein the first noise shielding member separates a space in which the other surface of the substrate and the lid member oppose to each other into a first space in which the first region and the lid member oppose to each other and a second space in which the second region and the lid member oppose to each other, and the first noise shielding member is electrically connected to at least one of a ground of the control circuit part mounted in the second region and the lid member; and a second noise shielding member that is provided in the second space in which the second region and the lid member oppose to each other, wherein an extension line in an extension direction of the second noise shielding member intersects the first noise shielding member, and the second noise shielding member is electrically connected to at least one of the ground of the control circuit part mounted in the second region and the lid member.

9. The power conversion device according to claim 8, wherein:

the extension line of the second noise shielding member is orthogonal to the first noise shielding member.

10. The power conversion device according to claim 8, wherein:

a plurality of second noise shielding members, each identical to the second noise shielding member, are provided.

11. The power conversion device according to claim 10, wherein:

the plurality of the second noise shielding members are arranged in parallel to each other.

12. The power conversion device according to claim 10, wherein:

two second noise shielding members are provided and a clearance between the two second noise shielding members becomes narrower toward the first noise shielding member.

13. The power conversion device according to claim 10, wherein:

two the second noise shielding members are provided and a clearance between the two second noise shielding members becomes wider toward the first noise shielding member.

* * * * *